United States Patent [19]

Bran

[11] Patent Number: 5,090,432
[45] Date of Patent: Feb. 25, 1992

[54] SINGLE WAFER MEGASONIC SEMICONDUCTOR WAFER PROCESSING SYSTEM

[75] Inventor: Mario E. Bran, Garden Grove, Calif.

[73] Assignee: Verteq, Inc., Anaheim, Calif.

[21] Appl. No.: 598,426

[22] Filed: Oct. 16, 1990

[51] Int. Cl.$^5$ ................................................ B08B 3/12
[52] U.S. Cl. ............................................ 134/139; 134/1; 134/184; 134/902
[58] Field of Search .................. 134/1, 139, 147, 155, 134/184, 186, 902; 68/355; 366/127

[56] References Cited

U.S. PATENT DOCUMENTS

| 2,760,501 | 8/1956 | Gander | 134/1 X |
| 3,077,155 | 2/1963 | Maddock et al. | 134/155 |
| 3,401,708 | 9/1968 | Henes | 134/1 X |
| 4,902,350 | 2/1990 | Steck | 134/1 |

FOREIGN PATENT DOCUMENTS

| 0319806 | 6/1989 | European Pat. Off. | 134/1 |
| 3212916 | 10/1983 | Fed. Rep. of Germany | 134/1 |
| 0069260 | 6/1979 | Japan | 134/139 |
| 0304733 | 12/1989 | Japan | 134/902 |

Primary Examiner—Philip R. Coe
Attorney, Agent, or Firm—Knobbe, Martens, Olson & Bear

[57] ABSTRACT

A semiconductor wafer processing system utilizing a specially constructed wet processing chamber for a single wafer and a megasonic, or high frequency, energy dispensing system. The construction of the container causes megasonic energy to become intensified near the surface of the wafer, thereby providing more cleaning power, and resulting cleaning. The megasonic device may be mounted on a bottom wall dump valve. Also, the energy output may be used to rotate a wafer.

10 Claims, 6 Drawing Sheets

SINGLE WAFER MEGASONIC SEMICONDUCTOR WAFER PROCESSING SYSTEM

FIELD OF THE INVENTION

The present invention relates to the processing of semiconductor wafers. More particularly, the present invention relates to an improved apparatus and method for the removal of contaminants from semiconductor wafers.

BACKGROUND OF THE INVENTION

Semiconductor devices operate by placing a plurality of regions of differently doped semiconductive material adjacent one another. The electrical proficiency of the device is strongly affected by the purity of the semiconductor materials used in fabricating the device. This is especially true as integrated circuits become smaller. Contaminants take up a greater percentage of real estate in smaller devices, leaving less room for desirable atoms. Thus, current is more critically limited by the purity of semiconductor materials in smaller devices.

Accordingly, the number of contaminating particles which adhere to the device during processing must be carefully controlled. Integrated circuits comprising semiconductor devices are typically fabricated in a clean room. Clean rooms are rooms which have strict controls as to the number of particles, such as dust, that are allowed to exist in the atmosphere of the room. However, it is impossible to ensure that no contaminating particles are present in a clean room. Even the highest grade clean room has particles present in the atmosphere, due to human operator presence and machinery for example, which can contaminate a wafer during processing.

Typically, semiconductor devices are processed in baths, such as etching solutions or cleaning solutions, left open to the atmosphere of the clean room. Dust particles, inherent even in clean rooms, settle on the surface of the bath liquid. As a wafer is inserted into or removed from a bath, the wafer is exposed to numerous particles settled on the surface of the bath. Thus, particles become attached to the semiconductor wafer surfaces during wet processing. Avoidance of contamination at the bath surface requires that a wafer be quickly inserted into or removed from a bath so that the wafer surfaces are not exposed to contaminants at the liquid/air interface for long periods of time.

Additionally imposing constraints on the time a wafer spends in a bath is the possible detrimental effect of the bath liquid on the surface of the wafer. For example, if a semiconductor is exposed to an etching solution for too long, too much of the semiconductor material may be etched away. Thus, the duration of a wafer's exposure to processing chemicals must be critically controlled.

Several instruments have been employed to purify wafers during processing which are germane to the present invention. One instrument, a megasonic energy cleaning apparatus, has been advantageously employed to clean contaminants from semiconductor surfaces. It is disclosed in U.S. Pat. No. 4,869,278 to Bran. Megasonic energy cleaning apparatuses comprise a piezoelectric transducer adhered to a transmitter. The transducer is electrically excited such that it vibrates. In combination with the transmitter, high frequency energy is emitted into a tank containing liquid, thereby vibrating the liquid in the tank.

When used in a semiconductor wafer wet processing tank, the vibrational energy is directed over the surfaces of semiconductor wafers. Contaminants are thus vibrated away from the surfaces of the wafer. When the wafer is removed, the surfaces are cleaner than if the wafer was merely inserted into a stationary bath of processing fluid.

Another device utilized to purify semiconductor wafers is disclosed in U.S. Pat. Nos. 4,633,893, 4,795,497, 4,856,544, and 4,899,767 to McConnell et al. In this device fluids flow continuously over the faces of the wafers, allowing the wafers to remain stationary and constantly submerged in liquid. Thus, during processing, no machinery is necessary to move the wafers from one bath to another and the wafers are not exposed to the atmosphere of the clean room. However, the bath liquid merely flows over the wafer surface, removing loose contaminants. If a contaminating particle is substantially stuck to the surface of the wafer, this system may not remove it.

It is clear from the above discussion that semiconductor wafer processing requires considerable supervision. Thus, batch processing, or the processing of a plurality of wafers simultaneously, is generally considered the most cost effective means. Batch processing typically increases the number of wafers processed per unit time with respect to the number of wafers that could be completed if a single wafer at a time were processed.

However, batch processing has many drawbacks. By processing a plurality of semiconductor wafers at the same time, contaminants from each wafer are released into the processing liquids. Additionally, if a cassette holding a plurality of wafers is accidently harmed during processing, by being dropped for example, each of the wafers is damaged, possibly beyond usefulness. As purity requirements are raised, they become increasingly difficult to achieve, particularly with an entire batch. Also, as wafers become larger and more costly, the processing of a large batch becomes riskier.

SUMMARY OF THE INVENTION

The present invention cleans a single semiconductor wafer at a time using a megasonic, or high frequency, energy cleaning system. The megasonic cleaning system is located at the bottom of the tank. Fluid enters the wet processing container from the bottom and can be allowed to overflow the container at the top. An additional exit is provided by a dump valve at the bottom of the wet processing container. The container and megasonic cleaning system are specially constructed to direct the flow of vibrational energy over each surface of the wafer. Additionally, the container can be constructed of materials which allow drying of the wafer to be performed in the container, thereby eliminating the possibility of damage to the wafer during transport to a drying area.

The present invention allows rapid processing of a single wafer. As cleaning liquid flows in and out of the container, contaminants are removed. This device can process a single wafer in an amount of time comparable to the amount lo of time per wafer taken in a typical batch processing system, when the yield reduction due to damage of a cassette holding a plurality of wafers is taken into account. In other words, since fewer wafers are lost when a single wafer is damaged, this system's average processing time can be comparable to a batch processing system.

DETAILED DESCRIPTION OF THE INVENTION

The present invention processes a single semiconductor wafer 10 using a specialized wet processing tank or container 20 in conjunction with a megasonic energy cleaning system 30. For simplicity the following discussion will focus on one aspect of the device, its wafer 10 cleaning capabilities. This in no way limits the use of the present invention solely to cleaning of semiconductor wafers 10. Other processes, such as etching, may be performed in the system of the present invention.

Figure 1:
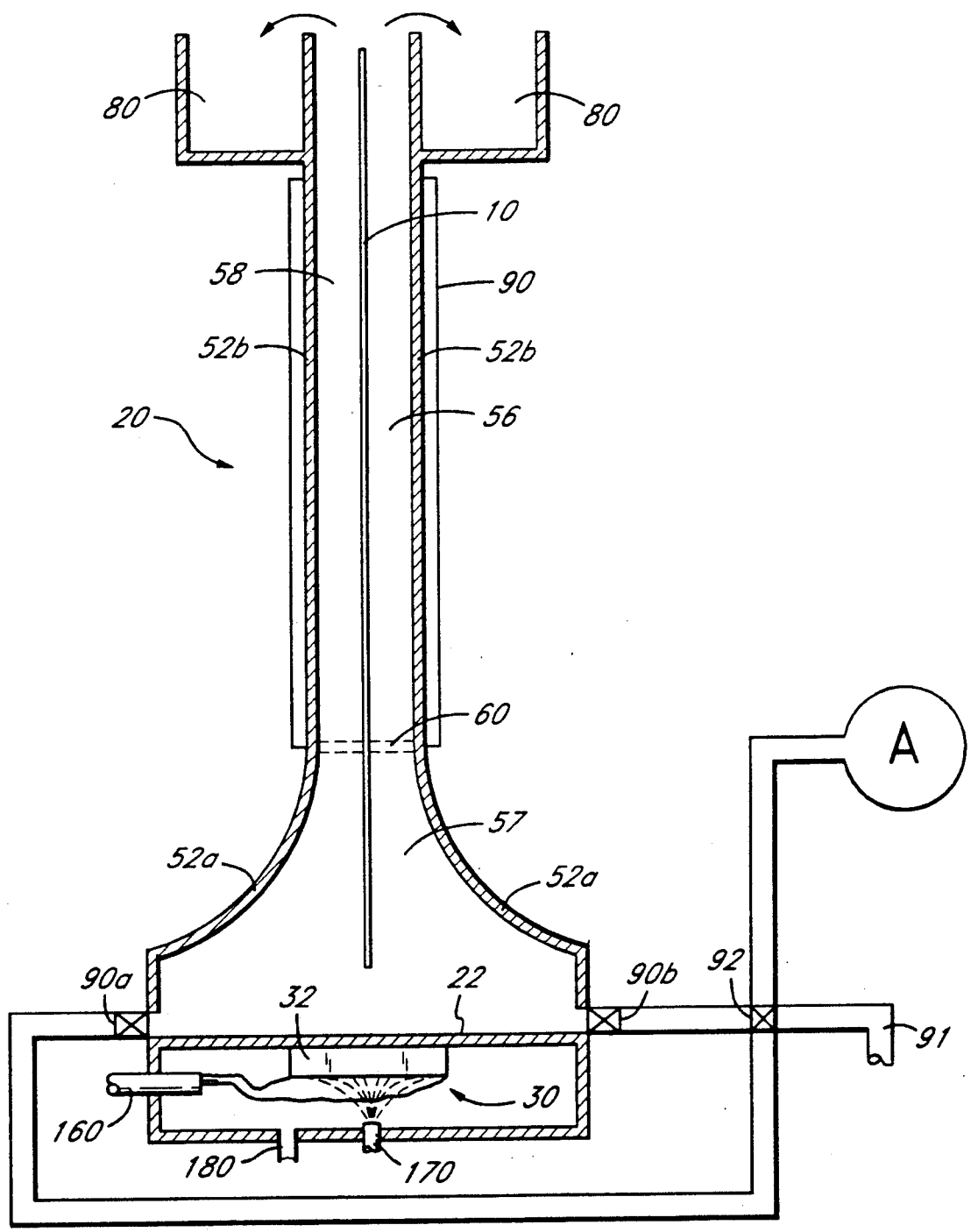
FIG. 1 is a schematic, cross-sectional, edge view of one embodiment of the present invention, illustrating a megasonic cleaning system mounted at the bottom of the wet processing container.
Figure 2:
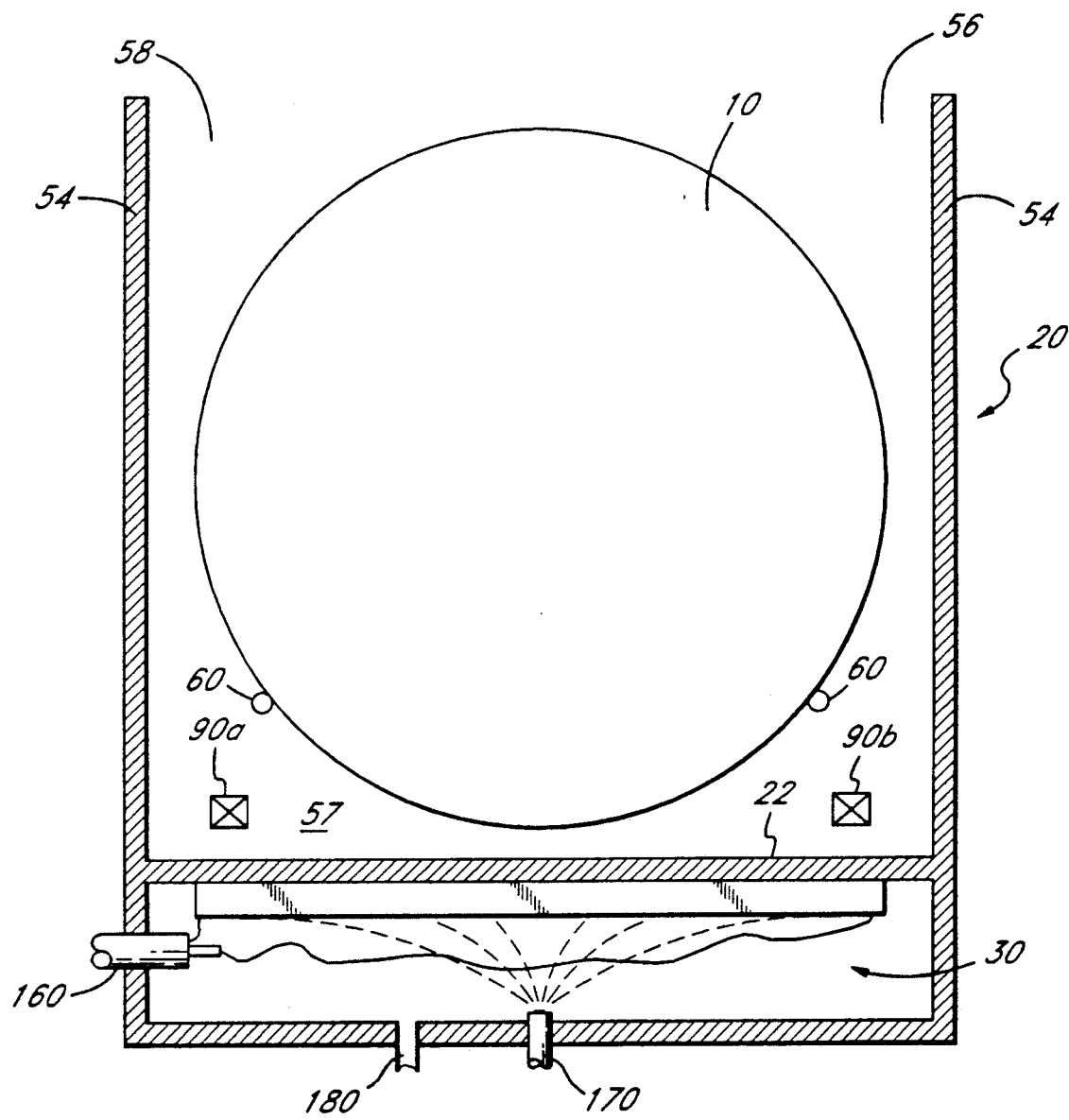
FIG. 2 is a schematic, cross-sectional front view of the embodiment of the present invention shown in FIG. 1.

Referring to FIGS. 1 and 2, there is shown a wet processing container 20 having a bottom wall 22 and four upstanding side walls, including a pair of wide side walls 52 and a pair of narrow edge walls 54 joined to the walls 52. The walls 52 include upwardly and inwardly sloping lower portions 52a leading to vertically extending upper portions 52b which have closely spaced, generally rectangular, parallel inner surfaces. The edge walls 54, as seen in FIG. 2, extend vertically and include lower portions that join the lower portions 52a of the side walls 52 and narrow upper portions which join the large flat upper portions 52b of the sidewalls 52.

A pair of spaced wafer supports 60 are shown adjacent the edge walls 54 and extending between the upper side wall portions 52b. While these supports 60 are schematically illustrated, they are intended to be suitably formed to engage and support a single disk shaped wafer 10 shown positioned within the container. As can be seen, the side walls 52 and 54 are slightly taller than the diameter of the wafer 10, and the width of the side walls portions 52b and the spacing of the edge walls 54 is slightly greater than the diameter of the wafer 10. The spacing between the side wall portions 52b is greater than the thickness of the wafer 10, but typically measures only $\frac{1}{4}$ to $\frac{1}{2}$ inch. Thus, it can be seen that the major portions of the side walls 52 and 54 define a generally flat, rectangular, vertically oriented space or chamber 56, with the wafer 10 being centrally aligned between the walls, slightly spaced from the side walls 52. Also, the lower edge of the wafer 10 is slightly spaced from the bottom wall 22.

The lower portions of the side walls create a vertically short, wide, upwardly sloping chamber 57 as seen in FIG. 1. This chamber 57 extends throughout the length of the wet processing container 20, as seen in FIG. 2. As noted from FIG. 1, the side walls 52 and 54 are open at the top of the container 20, thus creating a thin elongated slot like opening 58 through which the wafer 10 can be inserted and withdrawn. Note that the side walls extend only slightly above the upper edge of the wafer. Forming the wet processing container 20 in the manner described above and illustrated in FIGS. 1 and 2 results in a chamber which enables the wafer to be completely immersed in processing fluid. At the same time the close spacing of the walls 52 and 54 around the wafer 10 minimizes the amount of costly processing fluids needed. Two weirs 80 are located at the top of the tank 20, adjacent each sidewall 52 and 54. These weirs 80 catch fluids which overflow the wet processing tank 20. The tank 20 is preferably made of quartz but other materials may be needed for containing certain solutions.

Cleaning fluid is introduced into the wet processing tank 20 via inlets or ports 90a and 90b near the bottom 22 of the container 20. A plumbing system A feeds different fluids into a three-way valve 92 located outside the tank. When positioned in the first of its three directions, the three-way valve allows liquid to enter conduits which direct fluid into the ports 90a and 90b. In a second position, the valve 92 directs fluid to an outlet or drain 91. In the third of its three positions, the valve 92 is closed.

A piezo-electric transducer is adhered to the quartz bottom of the wet processing tank 20, thereby forming a megasonic energy cleaning system 30. The amount of vibrational energy available from the transducer 32 is limited by the size of the transducer 32, i.e., a larger transducer 32 produces more vibrational energy. As can be seen, the transducer width is much greater than the wafer thickness. In one prototype-version of the invention, the transducer is approximately one inch wide and as long as the diameter of the wafer.

The piezo-electric transducer 32 is electrically caused to vibrate via an electrical system 160 extending through on of the sidewalls 52, beneath the transducer 32. Additionally mounted beneath the transducer 32 is a cooling system comprising at least one nozzle 170 to spray coolant on the operating transducer 32 and a drain 180 to dispose of the coolant. The operating transducer 32 transmits vibrational energy into the bottom wall 22 of the wet processing container. The bottom wall 22, in turn, acts as a transmitter or coupler and vibrates, causing the liquid inside the container 20 to vibrate. Since the transducer 32 and the transmitter, or bottom wall 22 in this embodiment, are both generally flat in this embodiment, the vibrational energy is directed in a primarily vertical direction.

The chamber 57 formed inside the wet processing tank 20 captures much of the oscillatory energy produced by the vibrating transducer 32. The angled walls of the chamber 57 cause reflections of the vibrational energy produced by the transducer such that the energy becomes coupled into the upwardly extending chamber 56. The coupled energy rigorously vibrates the liquid in the narrow chamber 56. Thus, the specialized shape of the wet processing container 20 contributes to the cleaning power of the system. The large amount of energy relative to the narrow spaces surrounding the wafer 10 creates a visible effect wherein liquid actually bubbles upwardly at the top of the chamber 56.

When the cleaning process is complete, the three-way valve 92 is turned to its second position to allow a rinsing fluid, such as deionized water, to flow from the plumbing system, A, into the inlets 90a and 90b. The deionized water displaces the cleaning fluid which resides in the wet processing container 20, causing the cleaning fluid to overflow the top of the container 20 into the weirs 80 located at the upper edge of the container 20. The overflow fluid is disposed of by a plumbing system.

When the cleaning fluid is totally replaced by rinsing fluid, the three-way valve 92 is shut. The megasonic energy cleaning system 30 is then activated or it can remain activated during the fluid replacement step, providing the benefits of megasonic vibrational cleaning during the rinse cycle. Megasonic cleaning during the rinse cycle removes particles remaining stuck to the wafer 10 after the cleaning cycle. Thus, the semiconductor wafer 10 is greatly purified by receiving megasonic cleaning in the rinse cycle as well as the cleaning cycle.

To remove the contaminants from the rinse liquid, the three-way valve 92 is reopened to supply more deionized water. As deionized water enters the container 20, the contaminated water overflows the top of the container 20 into the weirs 80 and is disposed of. Several rinsing cycles can be executed to ensure purity of the wafer surface. Since the cleaning fluid overflows the top of the wet processing container 20 as the rinsing fluid displaces it, the semiconductor wafer 10 need not be transported from a cleaning tank to a rinsing tank. Thus, damage associated with transport is avoided. Additionally, contamination due to exposure to the atmosphere of the clean room, which previously occurred during transport between baths, is eliminated. Further, less mechanical equipment is necessary in the clean room, which reduces the number of contaminants present in the clean room.

When the rinsing process is complete, the wafer 10 may be moved to a drying area. This, however, requires mechanical equipment or the presence of a human operator. Hence, drying is preferably accomplished in the single processing container 20 to further reduce the number of contaminants created in the clean room and improve the quality of the wafer. As indicated, the wet processing container 20 of the present invention is preferably constructed from a transparent material, such as polished transparent quartz or sapphire. Shields 90 for generating an electric field can be applied parallel to the first sidewalls 52 of the upper portion of the wet processing container 20. When these shields 90 are activated, either an infrared, visible, or ultraviolet electromagnetic field is generated. The energy is able to pass through the sidewalls 52 of the wet processing container 20 to dry the wafer 10 within the container 20. Additionally, these electromagnetic fields can be employed to purify and sterilize the tank. Transparent container 20 walls allow, in addition to drying capabilities, observation of the process taking place.

Figure 3:
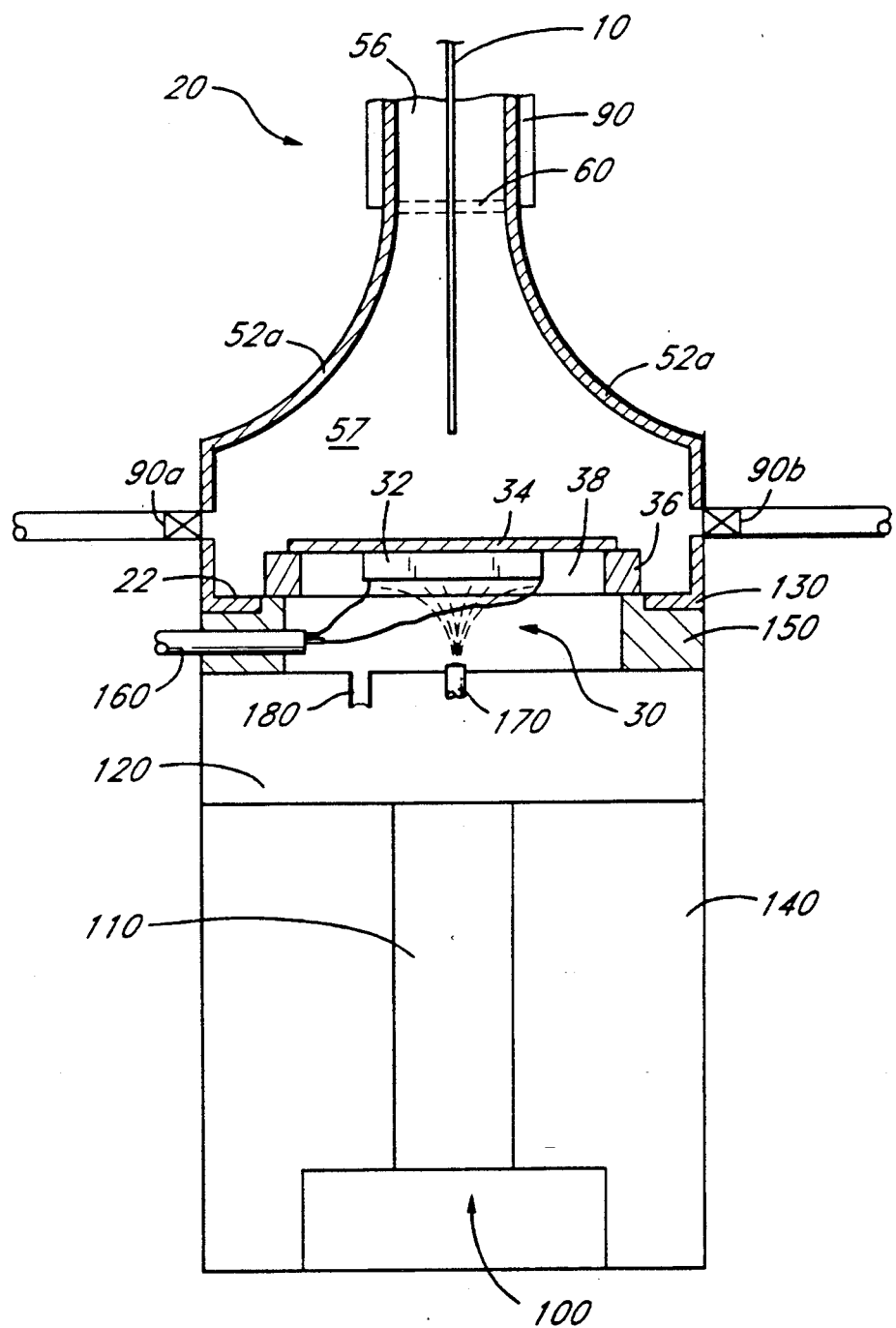
FIG. 3 is a schematic, cross-sectional partial edge view of another embodiment of the present invention, illustrating a megasonic cleaning system mounted atop a dump valve at the bottom of the wet processing container.

FIG. 3 shows a variation of the arrangement of FIGS. 1 and 2, wherein a dump valve 100 is employed at the bottom of the wet processing container 20. The shape of the wet processing container 20 and the placement of the wafer inside the chamber 56 are analogous to the previous embodiment. The dump valve 100 comprises a pneumatic piston 110 and a table 120, mounted atop the piston 110.

Additionally a receptacle 140 is beneath the bottom wall 22 of the tank 20. The receptacle 140 schematically illustrated has generally parallel sidewalls, spaced as far as the width of the bottom wall 22 of the wet processing tank 20. However, there is no restriction on the shape of the receptacle 140 except that it be able to capture and contain any fluid dumped from the container 20. The piston 110 is mounted within the receptacle 140, such that if there is fluid in the tank 20 and the piston 110 is retracted, the fluid descends into the receptacle 140.

When the piston 110 is extended, the sidewalls 52 of the container 20 abut the edges of the table 120. Thus, the table 120 makes up the bottom wall 22 of the wet processing container 20. A generally rectangular strip of material forms a gasket 130 between the abutting areas of the table 120 the sidewalls 52 such that a seal is created around the bottom wall 22 of the wet processing tank 20.

Atop the table is a megasonic energy cleaning system 30. A transducer 32 is adhered to the bottom of a flat transmitter 34 made of quartz. The transmitter 34 is mounted on a generally rectangular support 36 which has a large, generally rectangular orifice 38 at its center. The transducer 32 fits inside the orifice 38. The transmitter 34 and its support 36 are typically made of the same material, for example, sapphire or quartz. However, the two can be manufactured of any materials suitable for their purpose so long as the seal created between them is leak-proof. The transmitter 34 rests on its support 36. The support 36 is mounted on a base 150 having a large orifice beneath the transducer 32. The base is in turn mounted on the table 120. This arrangement creates an open area in which the transducer 32 is housed and shielded from the liquid inside the wet processing tank 20. The transducer 32 operates by placing a voltage across it, and obvious electrical precautions prohibit its exposure to liquid. Thus, the quality of the seal between the transmitter 34 and its support 36 is important in that the seal between the two protects the transducer 32 from exposure to liquid. The transmitter 34 and its support 36 fit inside the cross sectional area at the bottom 22 of the wet processing container 20. The longitudinal axis of the transmitter 34 is aligned with the longitudinal axis of the wet processing container 20.

The transducer 32 is energized by an electrical system 160 extending through one of the base 150 sidewalls. As the piezo-electric transducer 32 works to agitate the cleaning liquid in the wet processing container 20, the transducer 32 tends to become warm. Extended use of the transducer 32 may cause overheating. Thus, a cooling system, comprising one or more nozzles 170 (only one is shown) and a drain 180 are installed through the table 120, beneath the transducer. The nozzle 170 sprays coolant over the surface of the transducer 32 to prevent it from overheating as voltage is applied. The drain 180 allows the coolant to exit the box area. The nozzle 170 and drain 180 are shown severed in the Figures.

When the piston 110 is retracted, the table 120 is removed from the bottom 22 of the wet processing container 20, thereby dumping the liquid contents of the container 20 into the receptacle 140 beneath the container 20. When activated, the piston 110 retracts very quickly, opening a large orifice at the bottom 22 of the wet processing container 20. This causes extremely fast depletion of the liquid in the wet processing container 20 into the receptacle 140.

The speed of the dump valve time 100 contributes to the goal of clean wafers 10. Although this removal of the fluid is not critical in cleaning a semiconductor wafer, it is critical during other types of processing. For example, during etching of a wafer the length of time which the wafer is exposed to the etchant critically affects the amount of material etched away. Thus, extremely fast removal of the etchant allows precise control of the amount of material depleted from the surface of the wafer. Additionally, since the wafer remains in a single wet processing tank out of which the processing liquid is dumped, the possibility of damage during transport to a separate rinse bath is removed.

Figure 4:
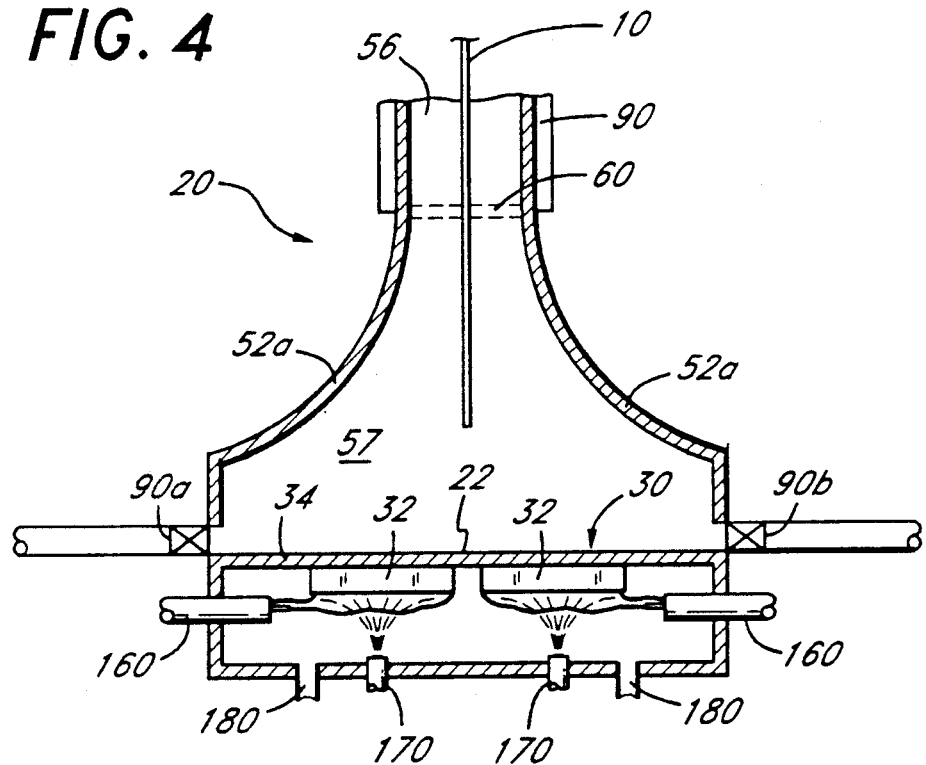
FIG. 4 is a schematic, cross-sectional partial edge view of another embodiment of the present invention, illustrating the use of dual transducers.

Yet another embodiment of the present invention is illustrated in FIG. 4. The construction of the wet processing container 20 is analogous to the construction of the wet processing container 20 of the previous embodiments. Thus, the previously discussed benefits of container 20 materials and shape are relevant in this embodiment. Additionally, a dump valve system 100 may be employed in this embodiment.

The notable distinction in this embodiment is the two transducers 32 adhered to the bottom wall 22 of the wet processing tank 20. The transducers 32 are approximately one inch wide and as long as the wafer's diameter. They are mounted very close to one another, toward the center of the bottom 22 of the container 20 such that the wafer 10 rests between the transducers 32. Electrical systems 160 extend, beneath the transducer 32, through two sidewalls 52 of the wet processing container 20. Additionally, a cooling system comprising nozzles 170 and drains 180 extends through the bottom support 22a of the container 20 and functions analogously to the cooling system in the single transducer 32 embodiment described above.

Two transducers 32 provide double the megasonic energy. The amount of energy a transducer 32 can supply is limited by its size, as discussed above. However, the size of a transducer is limited by the amount of resistance which builds up in the piezo-electric material as the size of the transducer 32 is enlarged. Additionally limiting the size are manufacturing tolerances. For example, piezo-electric material is made thinner as the transducer is made larger. The transducer 32 becomes very fragile when it is too thin. Thus, it is advantageous to employ a plurality of transducers 32 instead of a very large single transducer 32. The dual transducers 32 of this embodiment additionally aim energy parallel to each surface of the wafer 10 more efficiently than the single transducer 32 mounted directly beneath the wafer 10.

Figure 5:
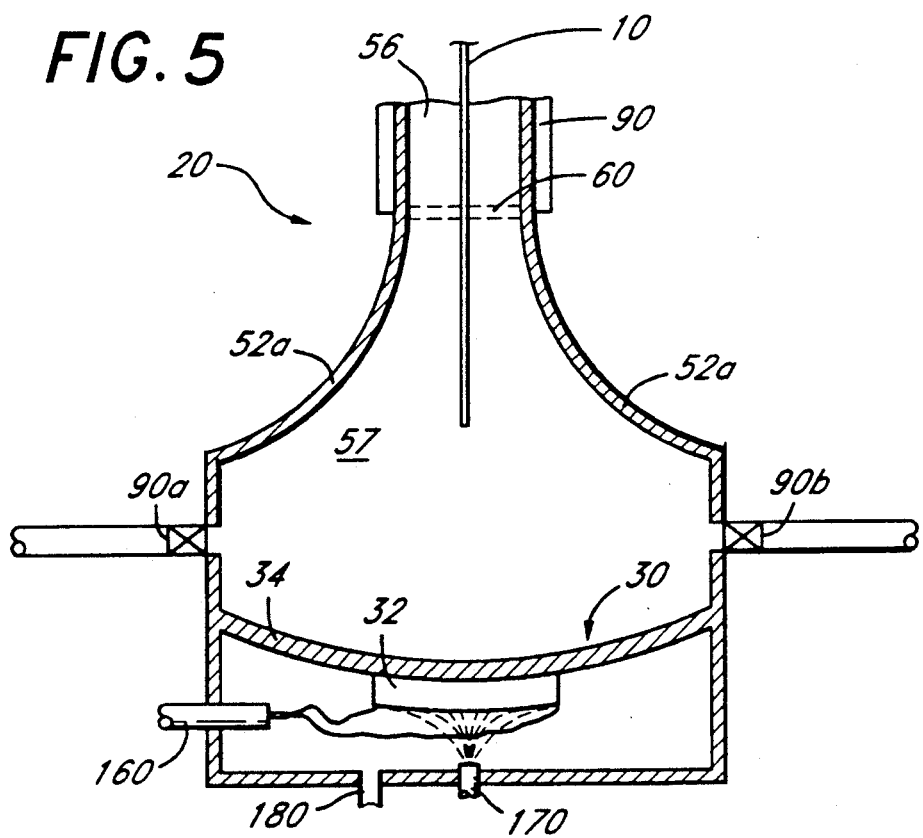
FIG. 5 is a schematic, cross-sectional partial edge view of another embodiment of the present invention, illustrating the use of a concave megasonic cleaning system incorporated in the bottom wall.

FIG. 5 shows another embodiment of the single semiconductor wafer 10 processing device of the present invention. Container 20 materials and construction are generally the same as in the previous embodiments, and thus its benefits are realized in this embodiment. Further, a dump valve system (not shown) may be employed in this embodiment.

The notable difference in this embodiment is the concave shape of the bottom wall 22 of the wet processing container 20. The concave bottom 22 of the tank acts as a transmitter for a concave transducer 32 adhered on the outside of the tank 20. The concave curvature of the megasonic cleaning system 30 directs megasonic vibrational energy to a point located a distance two times the radius of curvature of the concave bottom wall 22, or 2R, away from the apex of curvature. The curvature of the bottom wall 22 is designed in accordance with the dimensions of the container 20 such that the 2R distance is located at a point which causes the megasonic energy to be generally collimated and directed towards the entrance to the vertically extending portion of the chamber 57. The principal advantage of this approach is that the area of the transducer is increased over that of a flat transducer for a given width. Thus, the amount of energy transmitted is increased.

Figure 6:
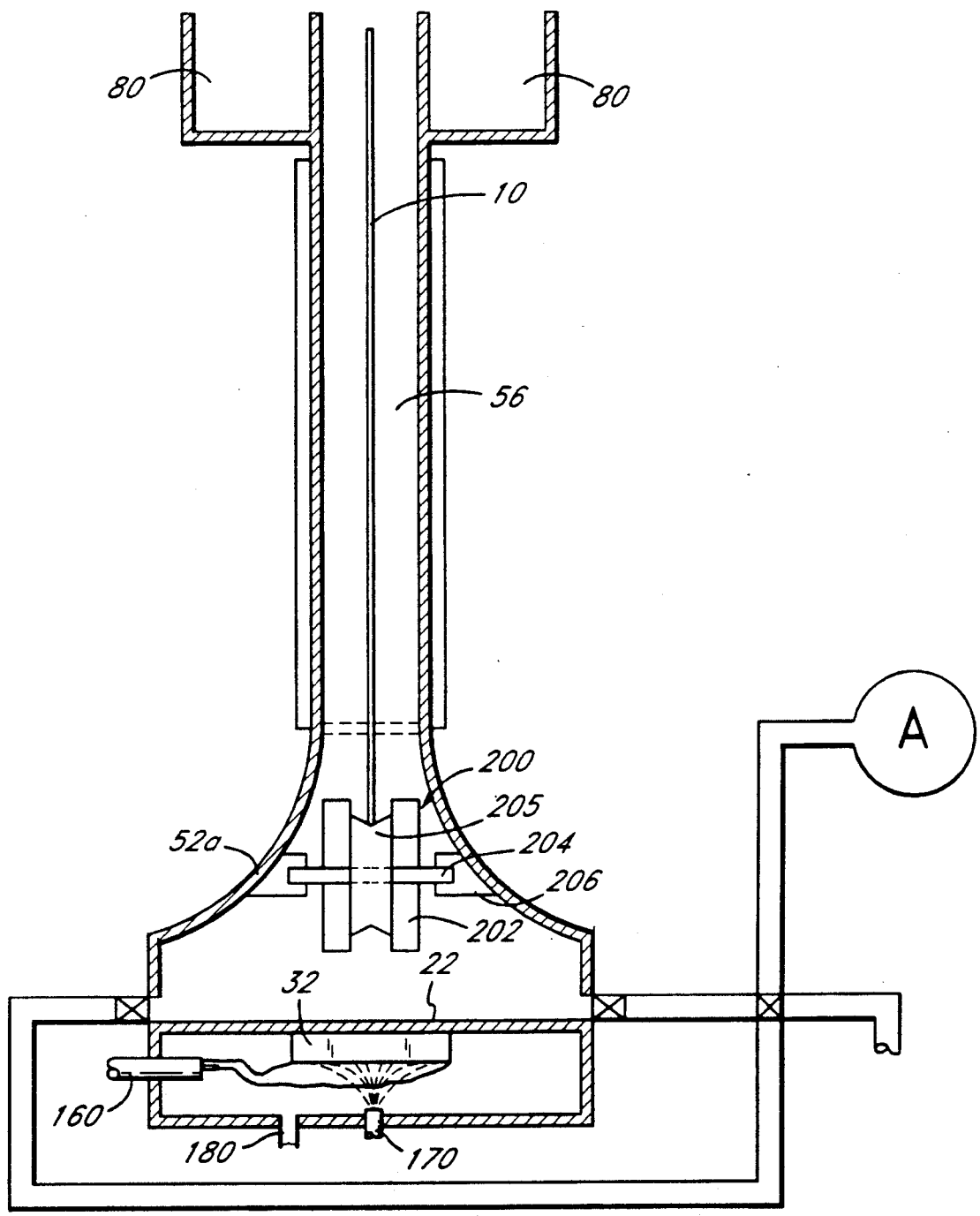
FIG. 6 is a schematic, cross-sectional end view of an impeller and roller system to rotate the wafer about its axis.
Figure 7:
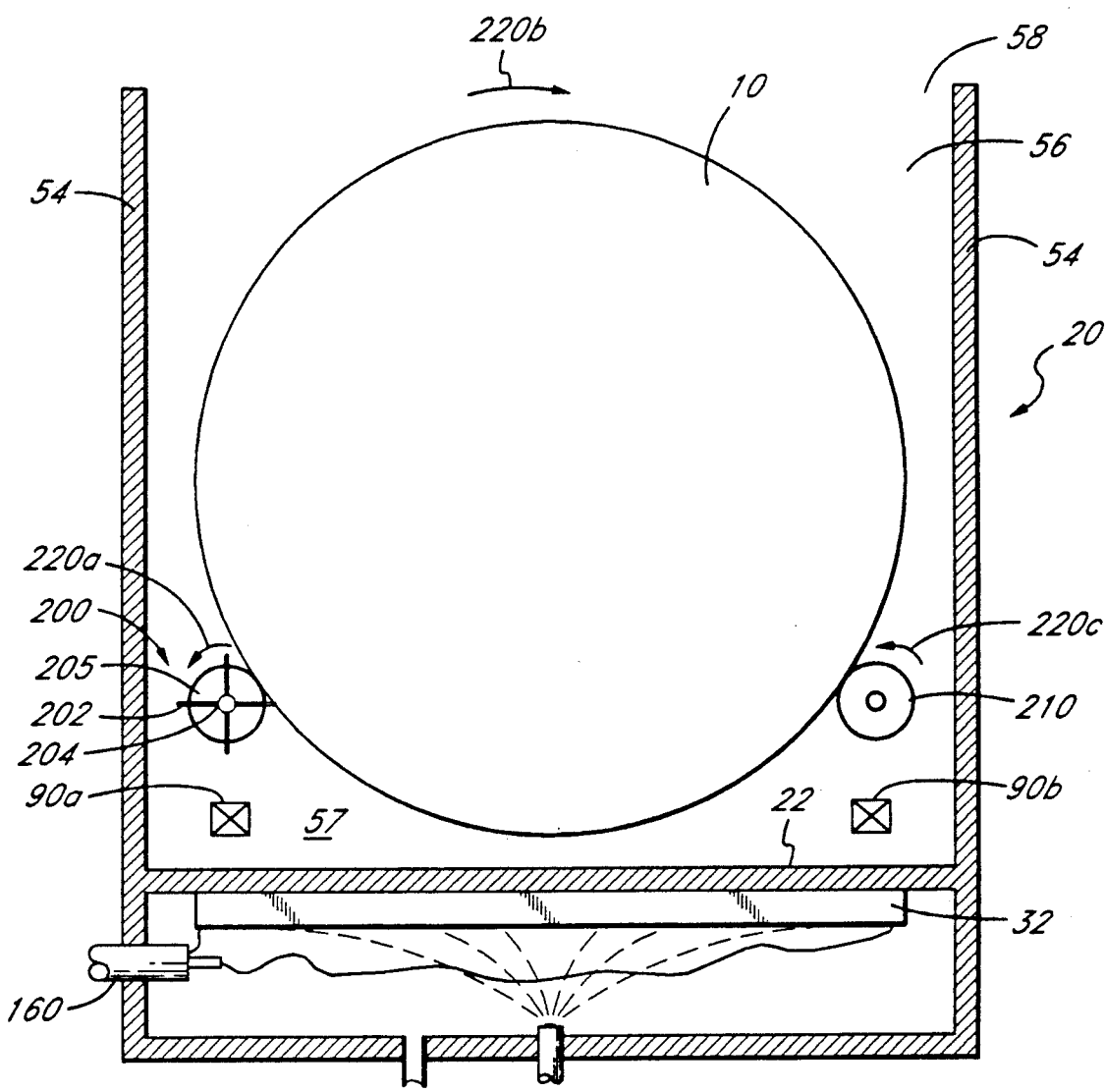
FIG. 7 is a schematic, cross-sectional front view of the embodiment shown in FIG. 6.

FIGS. 6 and 7 illustrate an impeller and rotator system which allows the wafer to rotate about its center using the liquid flow created by the megasonic energy cleaning system. This feature may be added to any of the above embodiments, however, it is illustrated using the structure of FIGS. 1 and 2.

Figure 8:
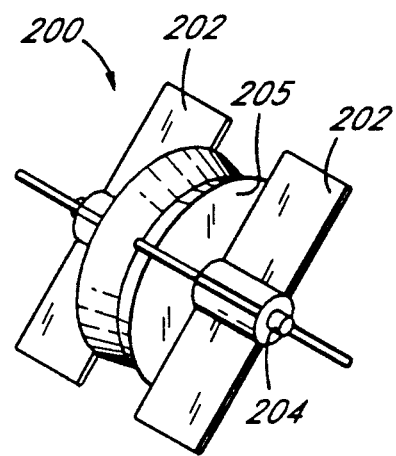
FIG. 8 is a perspective view of the impeller employed in the wafer rotating system illustrated in FIGS. 6 and 7.

A rotatably mounted roller/impeller 200 and a roller 210 replace the wafer supports 60. The element 200, shown in perspective in FIG. 8, has two impeller sections 202 which are typically fabricated from quartz, mounted on a rod 204. A ring-shaped wafer support or roller 205, typically made of a resilient material with a moderate coefficient of friction such as silicon, is mounted on the rod 204, between the impeller sections 202. The roller 205 preferably has a generally V-shaped surface. The rod 204 is supported by supports 206 attached to the sidewalls 52a of the wet processing tank 20. Thus, the roller 205 and impeller sections 202 can rotate about the rod 204. The roller 210 also has a V-shaped surface on which the wafer 10 rests and is centered.

The transducer 32 of the megasonic cleaning system 30 has dimensions such that its length corresponds to the distance between the centers of the impeller 200 and the roller 210. Thus, it directs megasonic vibrational energy in a vertical direction directly toward one-half of the impeller, causing it to rotate as shown by arrow 220a. As the impeller 200 rotates, the wafer rotates in the opposite direction, as shown by arrow 220b. The roller 210 is caused to rotate in the same direction as the impeller, as shown by arrow 220c. Thus, each point on the circumference of the wafer 10 is, for some length of time, in close proximity to the megasonic cleaner 30. Consequently, the wafer 10 is cleaned more uniformly.

Exploitation of single tank processing and the megasonic energy cleaning system 30 in the rinse cycle greatly improves the quality of the wafers 10. First, employing these devices reduces the amount of contamination on the wafer 10 surface. Particles which may not have been removed when the cleaning liquid was flooded from the container 20 are now agitated away from the surface of the wafer 10 with megasonic cleaning in the rinse cycle. Additionally, since the wafer 10 remains in the same container 20 for rinsing, apparatus to move the wafer 10 to a separate rinsing container is unnecessary. Thus, fewer particles are generated by the cleaning system. Furthermore, the reduction in mechanical apparatus reduces the cost of manufacturing semiconductor cleaning systems. Moreover, by retaining the wafer 10 in a single wet processing tank 20, the possibility of damage during transport from a first cleaning tank to a second rinsing tank is removed. In addition, there is no liquid/air interface through which the wafer 10 must pass during its withdrawal from the top of the wet processing tank 20. Thus, the possibility of contamination by particles typically trapped at this interface is removed, providing a cleaner wafer 10.

Additionally, if extra rinsing is desired, new rinsing agent can be added to the container 20 prior to drying. Since the used rinsing agent has been removed from the container 20, there is no worry of wafer 10 contamination by already removed particles.

Each of the above embodiments allow a single wafer 10 to be placed within a specially constructed wet processing tank 20 which intensifies the effect of the megasonic energy cleaning system 30. The specially constricted tank 20 ensures both surfaces of the wafer 10 are uniformly cleaned, without need to transport the wafer 10 from a first cleaning bath to a second rinsing bath and then to a separate drying area. Additions to any of the above embodiments provide for sterilization of the wet processing tank 20 in between operations and a means to rotate the wafer 10 such that a more uniformly clean surface is acquired. Furthermore, with the reduction in yield due to accidental damage during processing of a batch of wafers versus accidental damage during processing of a single wafer 10, the embodiments of the present invention provide a clean wafer 10 in a time approaching the time per wafer consumed in a batch processing system.

One skilled in the art will realize that the single wafer megasonic processing device of the present invention can be used for processes other than the cleaning of a semiconductor wafer. Further, the megasonic cleaning apparatus can be of various designs which when coupled with the shape of the wet processing container will intensify the vibrational energy in the narrow, vertically extending region of the wet processing tank.

What is claimed is:

1. Apparatus for cleaning a single semi-conductor wafer at one time comprising:
    a container having a bottom wall and a plurality of upstanding walls, supports in said container for supporting a wafer such that two large flat, spaced surfaces of the wafer extend generally vertically, said upstanding walls including upper portions defining a thin, flat vertically oriented space for receiving a wafer, said space having a generally rectangular cross section defined by two side walls having flat, generally vertically oriented surfaces closely spaced from each other, said side walls being joined by two edge walls which are spaced from each other a distance slightly greater than a diameter of said wafer, said upstanding walls extending to an open upper end for receiving and permitting withdrawal of a wafer from said container; and
    a device in the lower portion of said container for propagating megasonic energy upwardly in said container to agitate cleaning liquid in the container for purposes of dislodging particulates from the surfaces of a wafer.

2. The apparatus of claim 1 wherein said device is adapted to provide megasonic energy sufficient to agitate cleaning solution on both sides of said wafer at one time throughout the entire width of the wafer.

3. The apparatus of claim 2 wherein said device is mounted on said bottom wall and occupies an area substantially greater than the cross section of said container upper end, said container side walls including lower portions attached to said bottom wall and tapering upwardly and inwardly to join said upper portions, said lower portions being sloped to guide megasonic energy into said upper portion.

4. The apparatus of claim 2, wherein said device includes a transducer having surface area much greater than said space cross section, said transducer producing megasonic energy directed vertically in a pattern larger than said cross section, said container side walls including a lower portion extending from said bottom wall surrounding said transducer and tapering inwardly to join said upper portion, whereby some of the megasonic energy is directed against the side walls and deflected upwardly and inwardly to produce agitation of liquid adjacent a wafer positioned in the container.

5. The apparatus of claim 1, wherein said bottom wall and said device are mounted on a piston which is adapted to lower and raise the bottom wall such that the bottom wall can serve as a valve to quickly dump the contents of the container.

6. The apparatus of claim 1, wherein said container side walls are made of transparent material such that wafer drying energy may be transmitted through the container walls to impinge on a wafer positioned in the container.

7. The apparatus of claim 1, including a driver in said container powered by the flow of liquid caused by said megasonic energy in said container for rotating said wafer.

8. An apparatus for cleaning a wafer comprising:
    a container having a bottom wall and upstanding side walls defining a space for receiving a semiconductor wafer and a quantity of cleaning solution, a support in said container for engaging the edge of the wafer and supporting the wafer with two large flat sides of the wafer extending vertically;
    a megasonic energy propagating device located adjacent said bottom wall for directing megasonic energy upwardly into cleaning solution positioned in said container around a wafer to remove particles from the wafer; and
    a driver powered by the upward flow of liquid caused by said megasonic energy for rotating a wafer supported in said container.

9. The apparatus of claim 8, including an impeller mounted in said container positioned in the path of said energy and liquid movement in a manner to cause the impeller to rotate.

10. Apparatus for cleaning a thin flat element comprising:
    a container having a lower portion and an open upper end for receiving said element, said lower portion having a pair of spaced side walls that taper upwardly and inwardly towards each other to define a thin flat vertically oriented space for receiving said element; and
    a device in the lower portion of said container for propagating megasonic energy upwardly in said container to agitate cleaning fluid in the container for purposes of dislodging particles from the surfaces of said element, said device producing megasonic energy directed vertically in a pattern larger than the horizontal cross section of the upper end of said container so that some of the megasonic energy is directed against the container side walls and deflected upwardly and inwardly to produce agitation of cleaning liquid in the container adjacent said element.

* * * * *

UNITED STATES PATENT AND TRADEMARK OFFICE
CERTIFICATE OF CORRECTION

PATENT NO. : 5,090,432
DATED : February 25, 1992
INVENTOR(S) : Mario E. Bran

It is certified that error appears in the above-identified patent and that said Letters Patent is hereby corrected as shown below:

Column 10,
Line 10, after "upper", delete "portion" and insert -- end --.

Signed and Sealed this

Fourteenth Day of February, 2006

JON W. DUDAS
*Director of the United States Patent and Trademark Office*